(12) United States Patent
Ganju et al.

(10) Patent No.: US 12,550,299 B2
(45) Date of Patent: Feb. 10, 2026

(54) INTELLIGENT COMPONENTS OF A DATA CENTER

(71) Applicant: NVIDIA CORPORATION, Santa Clara, CA (US)

(72) Inventors: Siddha Ganju, Santa Clara, CA (US); Fred Devoir, Pilot Point, TX (US); Elad Mentovich, Tel Aviv (IL); Ryan Albright, Beaverton, OR (US); Tahir Cader, Spokane Valley, WA (US); Kenneth Misin, Campbell, CA (US); William Mecham, Elk Grove, CA (US); Benjamin Goska, Portland, OR (US); Jordan Levy, Portland, OR (US); Aaron Carkin, Hillsboro, OR (US); Michael Thompson, Wilsonville, OR (US); William Ryan Weese, Portland, OR (US); Ran Rakovsky, Ganei Tiqwa (IL); Rotem Barzilay, Shimshit (IL); Itamar Frenkel, Kiryat Bialik (IL); Yaakov Gridish, Yoqneam (IL)

(73) Assignee: Nvidia Corporation, Santa Clara, CA (US)

( * ) Notice: Subject to any disclaimer, the term of this patent is extended or adjusted under 35 U.S.C. 154(b) by 458 days.

(21) Appl. No.: 18/144,971

(22) Filed: May 9, 2023

(65) Prior Publication Data
US 2024/0381582 A1    Nov. 14, 2024

(51) Int. Cl.
H05K 7/20 (2006.01)
H05K 7/14 (2006.01)

(52) U.S. Cl.
CPC ....... *H05K 7/20745* (2013.01); *H05K 7/1491* (2013.01)

(58) Field of Classification Search
CPC .............. H05K 7/1491; H05K 7/20745
(Continued)

(56) References Cited

U.S. PATENT DOCUMENTS

| 11,832,416 B1 * | 11/2023 | Albright | ............ H05K 7/1492 |
| 2005/0038562 A1 * | 2/2005 | Bash | ............... G11B 15/6835 |

(Continued)

OTHER PUBLICATIONS

Albright et al., pending U.S. Appl. No. 17/903,547, "Motel Tracking of Datacenter Components", filed Sep. 6, 2022.
(Continued)

*Primary Examiner* — Zhengfu J Feng
(74) *Attorney, Agent, or Firm* — Moore & Van Allen PLLC; R.W. McCord Rayburn

(57) ABSTRACT

Some embodiments described herein provide intelligent movable racks for a data center and a central system for monitoring and directing the positioning of such racks within the data center. For example, a rack may include computing equipment as well as a power system, a cooling system, and a cabling system (e.g., for data communication). The rack may include a controller in communication with the computing equipment, the power system, the cooling system, and the cabling system. The rack may also include a rack interface for physically supporting the rack and operatively connecting the systems of the rack to power, cooling, and cabling infrastructure of the data center. The rack interface may receive an autonomous robot for moving the rack within the data center. The controller may control the power system and the cooling system based in part on the autonomous movement of the rack.

24 Claims, 5 Drawing Sheets

(58) Field of Classification Search
USPC .......................................................... 361/694
See application file for complete search history.

(56) References Cited

U.S. PATENT DOCUMENTS

| | | | |
|---|---|---|---|
| 2013/0231779 A1* | 9/2013 | Purkayastha | B25J 9/1697 |
| | | | 700/258 |
| 2018/0027686 A1* | 1/2018 | Adiletta | G06F 9/544 |
| 2019/0062053 A1* | 2/2019 | Jensen | H05K 7/20209 |
| 2019/0174651 A1* | 6/2019 | Crawford | H05K 7/1497 |
| 2023/0082410 A1* | 3/2023 | Enright | H05K 7/20318 |
| | | | 361/679.46 |

OTHER PUBLICATIONS

Ganju et al., pending U.S. Appl. No. 18/223,229, "Methods, Systems, and Computer Program Products for Datacenter Visualization", filed Jul. 18, 2023.
Albright et al., pending U.S. Appl. No. 18/195,064, "Methods, Systems, and Computer Program Products for Asset Identification and Visualization", filed May 9, 2023.

* cited by examiner

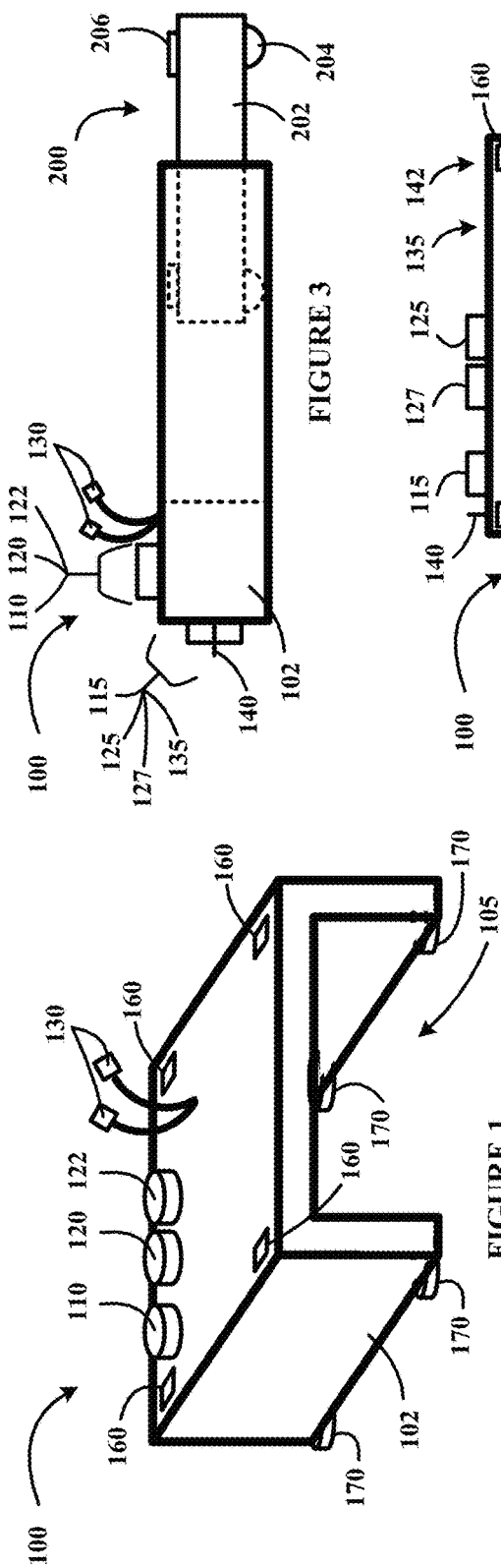
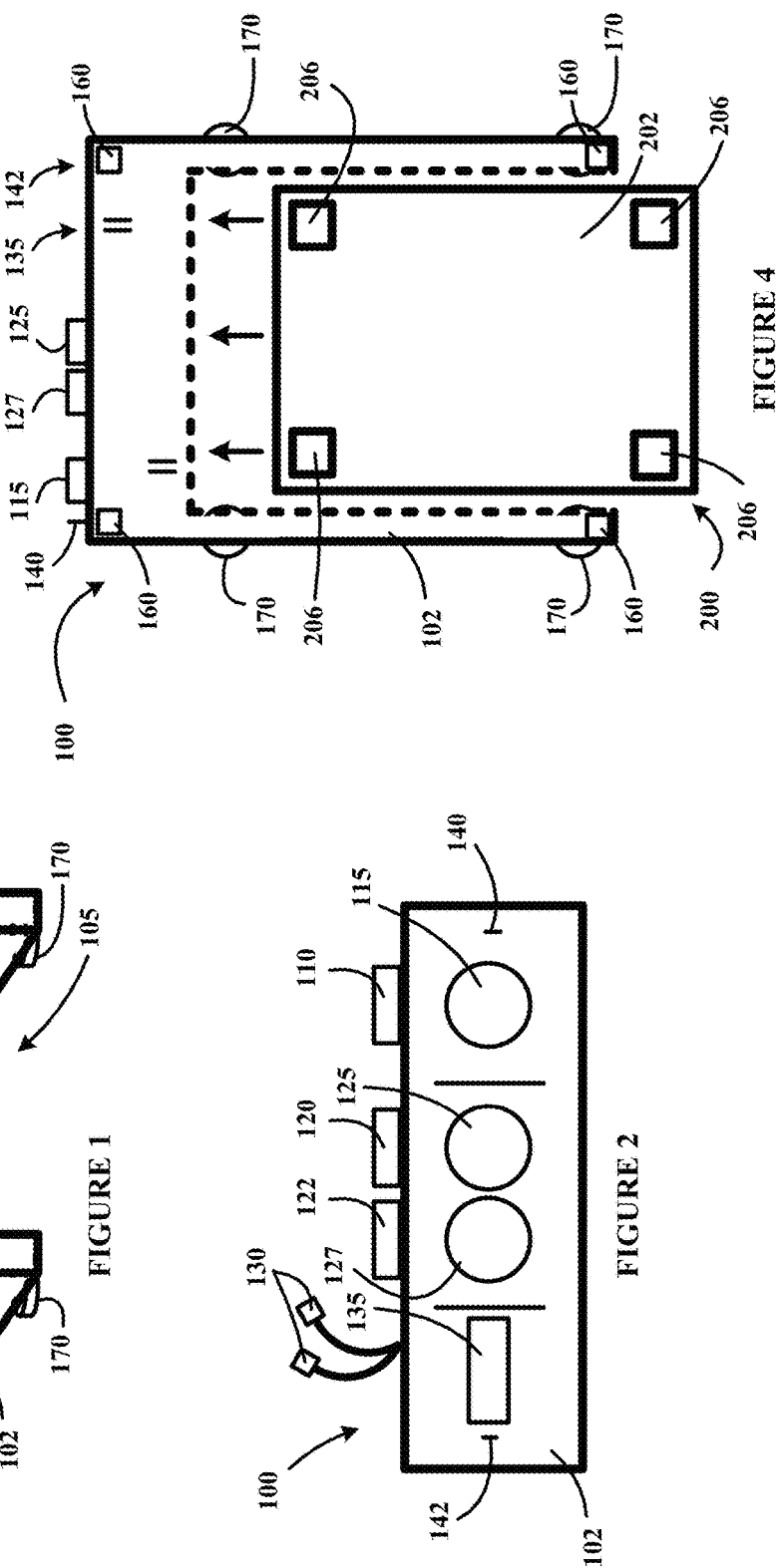

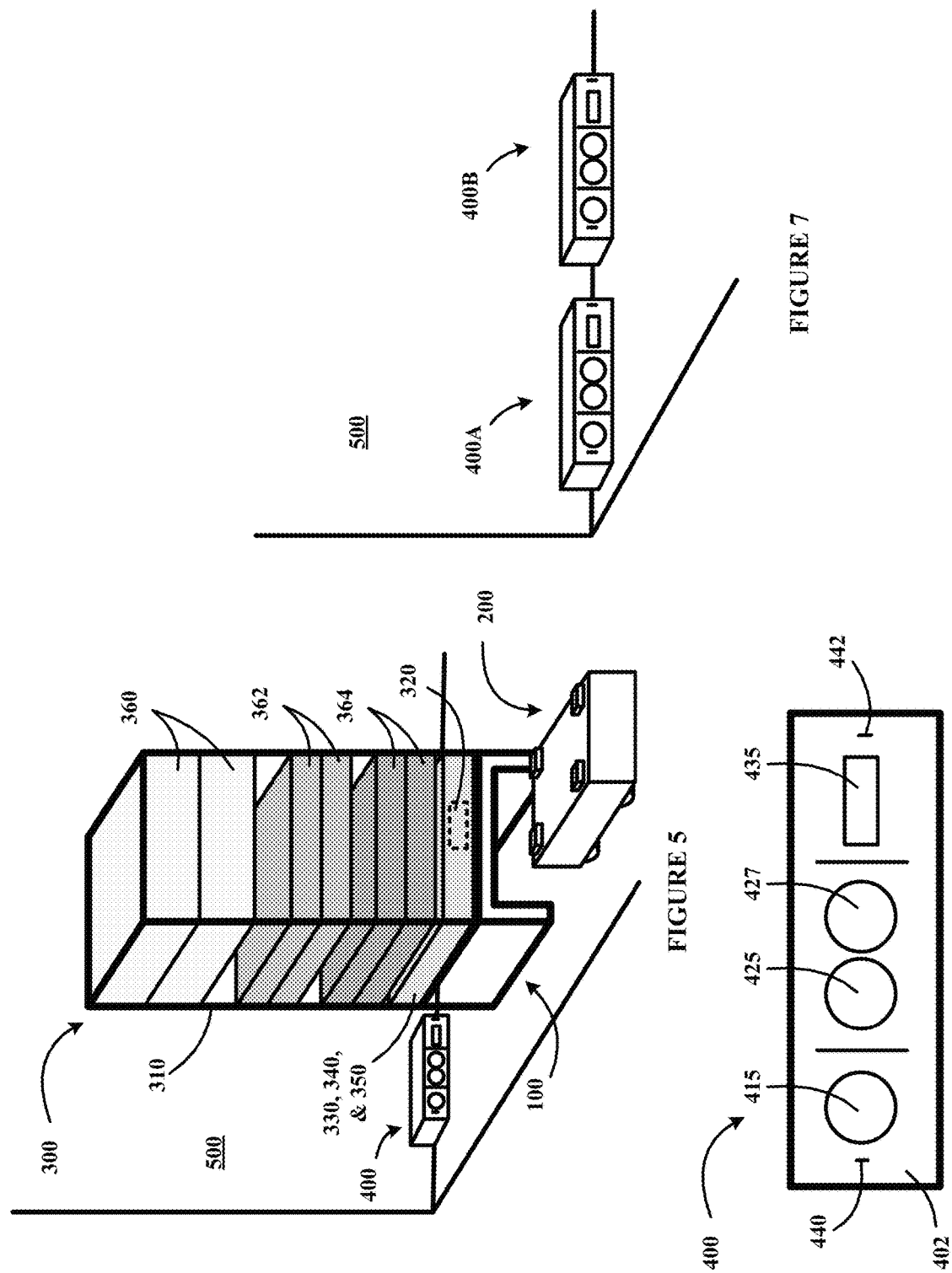

INTELLIGENT COMPONENTS OF A DATA CENTER

FIELD OF THE INVENTION

The present invention relates to intelligent components of a data center.

BACKGROUND

Data centers may include a plurality of racks for supporting computing equipment within the data center. The computing equipment on a given rack may be powered by a power system that receives power from power infrastructure of the data center and may be cooled by a cooling system that interfaces with cooling infrastructure of the data center. Additionally, the computing equipment may be connected to data communication infrastructure of the data center by a cabling system.

SUMMARY

The following presents a simplified summary of one or more embodiments of the present invention in order to provide a basic understanding of such embodiments. This summary is not an extensive overview of all contemplated embodiments and is intended to neither identify key or critical elements of all embodiments nor delineate the scope of any or all embodiments. This summary presents some concepts of one or more embodiments of the present invention in a simplified form as a prelude to the more detailed description that is presented later.

In one aspect, the present invention is directed to a rack for a data center. The rack may include a controller configured to be in communication with computing equipment in the rack and a framework configured to physically support, within a data center, the computing equipment and the controller. The rack may also include a rack interface in communication with the controller and configured to physically support the framework, operatively connect at least the computing equipment with a receiver of a data center, and receive an autonomous robot configured to move the rack within the data center. The controller may be configured to control functionality of the computing equipment during movement of the rack by the autonomous robot.

In some embodiments, the data center may include a first receiver and a second receiver, where the first and second receivers are in different locations within the data center. The rack interface may be configured to permit movement of the rack from the first receiver to the second receiver by disconnecting the rack interface from an operative connection with the first receiver and operatively connecting the rack interface to the second receiver following movement of the rack.

In some embodiments, the rack interface may be configured to operatively connect a power system, a cooling system, and a cabling system to the receiver of the data center. The controller may be configured to control the power system, the cooling system, and/or the cabling system based on the movement of the rack by the autonomous robot.

In some embodiments, the rack interface may be configured to mechanically align with the receiver of the data center, such that mechanical alignment of the rack interface with the receiver causes connectors of the power system, the cooling system, and/or the cabling system to mechanically align with corresponding connectors of the receiver.

In some embodiments, the rack interface may include (i) a power connector configured to connect, via the receiver, the power system to power infrastructure of the data center, (ii) a cooling connector configured to connect, via the receiver, the cooling system to cooling infrastructure of the data center, and (iii) a cabling connector configured to connect, via the receiver, the cabling system to data communication infrastructure of the data center.

In some embodiments, the controller may be configured to receive operational data from the power system, the cooling system, and/or the cabling system and provide the operational data to a central system of the data center. Each of the power system, the cooling system, and/or the cabling system may include a sensor configured to generate a signal, and the operational data may be based on the signal from each sensor.

In some embodiments, the controller may be configured to, after movement of the rack within the data center, determine whether the rack interface is operatively connected to the receiver. The controller may be configured to, in response to determining that the rack interface is operatively connected to the receiver, activate the cooling system, after activating the cooling system, determine whether the cooling system has achieved an operational threshold, and, in response to determining that the cooling system has achieved the operational threshold, activate the power system to provide power from power infrastructure of the data center to the computing equipment. In some embodiments, the cooling system may include fans, activating the cooling system may include turning on the fans, and the operational threshold may include a speed of the fans. Additionally, or alternatively, the cooling system may include coolant piping, activating the cooling system may include initiating a flow of coolant through the coolant piping, and the operational threshold may include a volume flow rate of the coolant.

In some embodiments, the controller may be configured to receive an indication that the rack is to be moved, and, in response to receiving the indication, deactivate the power system to shut down the computing equipment and determine whether the computing equipment has achieved a threshold temperature. The controller may be configured to, in response to determining that the computing equipment has not achieved the threshold temperature, prevent movement of the rack and maintain operation of the cooling system to continue cooling the computing equipment. The controller may be configured to, in response to determining that the computing equipment has achieved the threshold temperature, deactivate the cooling system and, after deactivating the cooling system, permit movement of the rack.

In some embodiments, the rack interface may be configured to operatively connect to the receiver of the data center based on at least one of a horizontal movement of the rack with respect to the receiver or a vertical movement of the rack with respect to the receiver.

In some embodiments, the rack interface may be configured to engage the autonomous robot moving along a floor surface of the data center and to remain engaged with the autonomous robot as the autonomous robot lifts the rack from the floor surface to move the rack within the data center.

In some embodiments, the rack interface may be positioned on a bottom surface of the framework and oriented toward a floor surface of the data center, and the rack interface may be configured to operatively connect to the receiver of the data center based on a vertical movement of the rack with respect to the receiver.

In some embodiments, the controller may be configured to transmit a command to the autonomous robot to move the rack to within a desired distance from another rack of the data center.

In some embodiments, the rack may include an independent power supply supported by the framework, where the independent power supply is configured to provide, during movement of the rack, power to the controller.

In some embodiments, the controller may be configured to receive data from one or more sensors, determine, based on the data, an optimal position for the rack within the data center, and, if the optimal position does not correspond to a current position of the rack within the data center, transmit a command to the autonomous robot to move the rack to the optimal position.

In another aspect, the present invention is directed to a system for autonomously moving racks within a data center. The system may include an autonomous robot configured to lift racks from a floor surface of a data center and move the racks within the data center. The system may also include a rack interface configured to physically support a framework of a rack within the data center, operatively connect systems of the rack to a receiver of the data center, and receive the autonomous robot and permit the autonomous robot to move the rack within the data center.

In another aspect, the present invention is directed to a rack interface for enabling autonomous movement of a rack within a data center. The rack interface may include a housing configured to physically support a framework of a rack within a data center and receive an autonomous robot for moving the rack within the data center. The rack interface may also include one or more connectors positioned on the housing and configured to operatively connect systems of the rack to a receiver of the data center.

In some embodiments, the one or more connectors may be positioned on the housing such that relative movement of the rack interface with respect to the receiver operatively connects the systems of the rack to the receiver.

In some embodiments, the rack interface may include one or more alignment guides for aligning the one or more connectors with the receiver.

In some embodiments, the rack interface may include one or more openings for receiving one or more alignment guides of the receiver for aligning the one or more connectors with the receiver.

In some embodiments, the rack interface may include one or more locking mechanisms for engaging the framework of the rack.

In some embodiments, the rack interface may include one or more locking mechanisms for engaging a floor surface of the data center.

The features, functions, and advantages that have been discussed may be achieved independently in various embodiments of the present invention or may be combined with yet other embodiments, further details of which may be seen with reference to the following description and drawings.

BRIEF DESCRIPTION OF THE DRAWINGS

Figure 8:
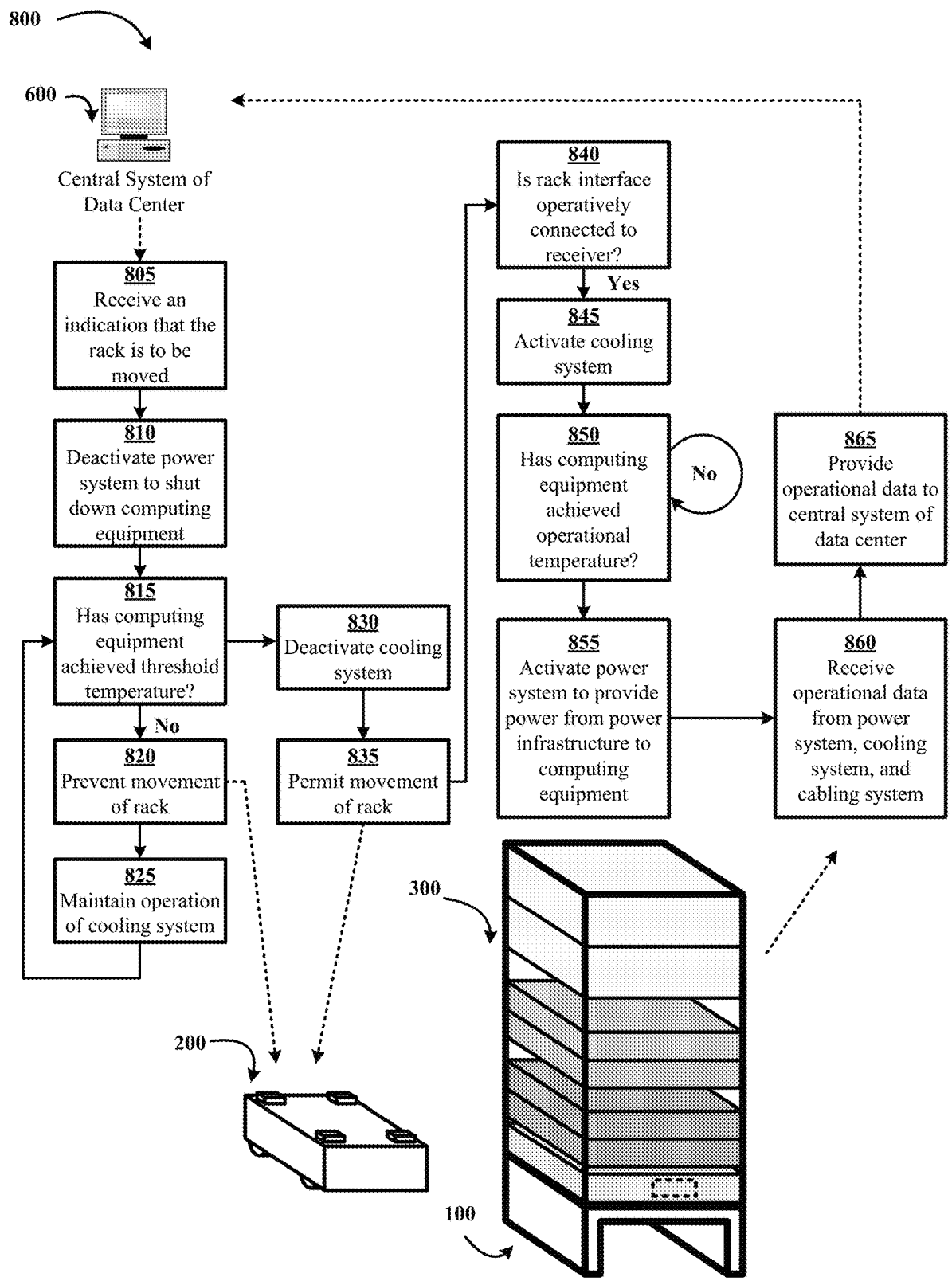
Figure 9:
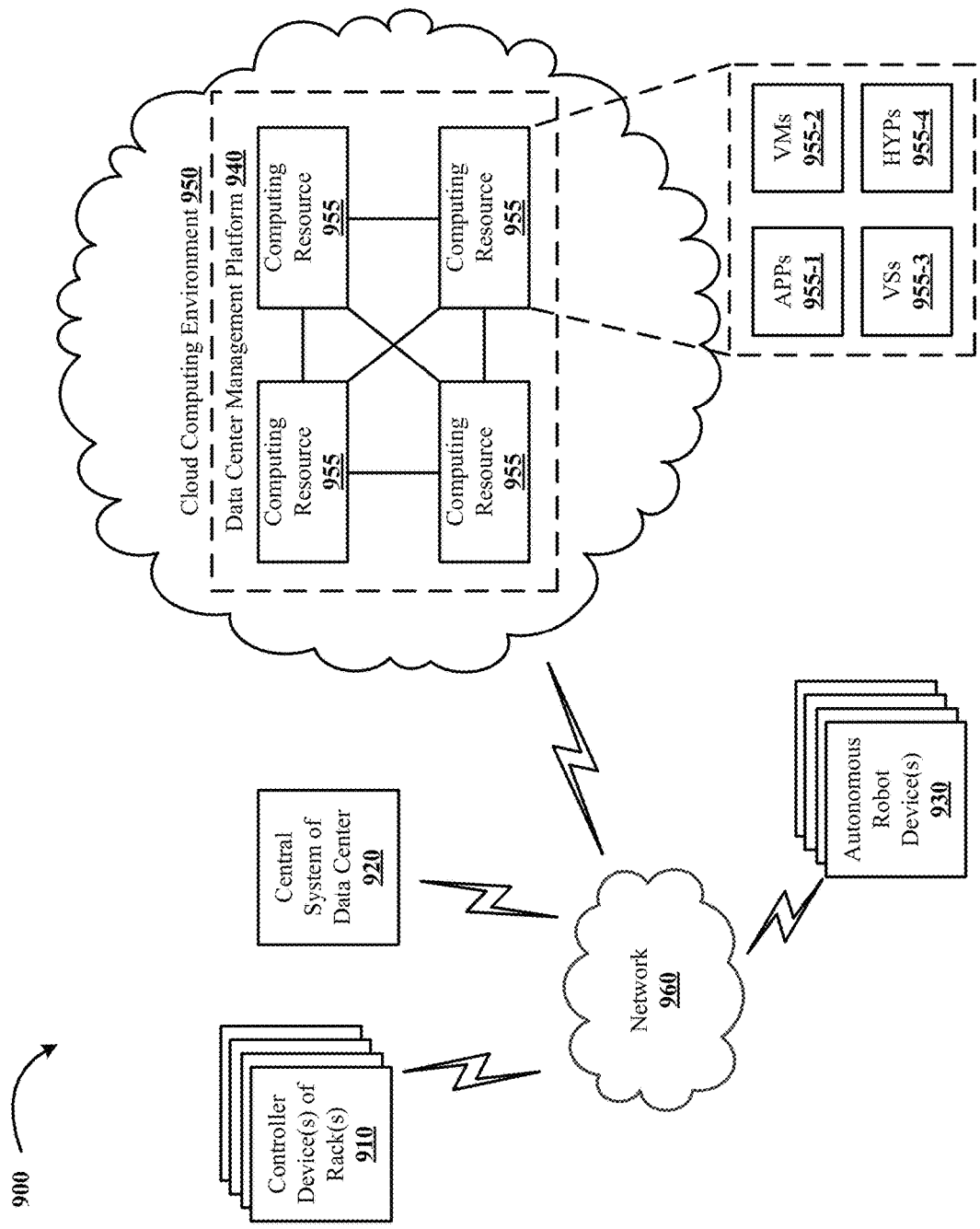
Figure 10:
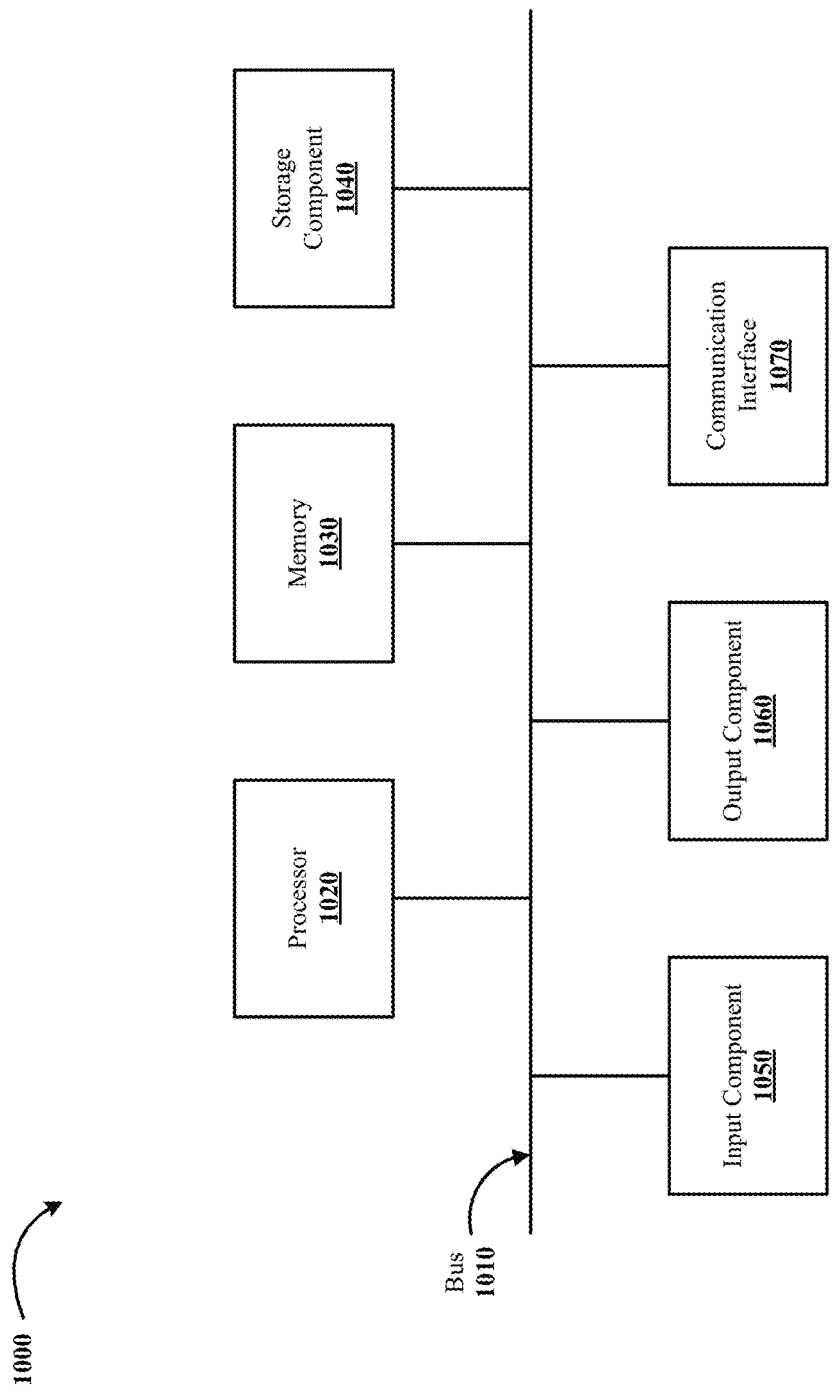

Having thus described embodiments of the invention in general terms, reference will now be made the accompanying drawings, wherein:

FIG. 1 illustrates a front perspective view of a rack interface, in accordance with an embodiment of the invention;

FIG. 2 illustrates a rear view of the rack interface of FIG. 1, in accordance with an embodiment of the invention;

FIG. 3 illustrates a side view of the rack interface of FIG. 1 and an autonomous robot, in accordance with an embodiment of the invention;

FIG. 4 illustrates an overhead, cutaway view of the rack interface of FIG. 1 and the autonomous robot of FIG. 3, in accordance with an embodiment of the invention;

FIG. 5 illustrates a perspective view of the rack interface of FIG. 1, the autonomous robot of FIG. 3, a rack, and a receiver within a data center, in accordance with an embodiment of the invention;

FIG. 6 illustrates a front view of the receiver of FIG. 5, in accordance with an embodiment of the invention;

FIG. 7 illustrates a perspective view of multiple receivers within a data center, in accordance with an embodiment of the invention;

FIG. 8 illustrates a diagram and method of intelligently managing a rack within a data center, in accordance with an embodiment of the invention;

FIG. 9 illustrates a system environment for intelligent data center management, in accordance with an embodiment of the invention; and FIG. 10 is a diagram of example components of one or more devices associated with the rack interface, autonomous robot, and/or data center or system environment of the same, in accordance with an embodiment of the invention.

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Furthermore, when it is said herein that something is "based on" something else, it may be based on one or more other things as well. In other words, unless expressly indicated otherwise, as used herein "based on" means "based at least in part on" or "based at least partially on." Also, as used herein, the term "or" is intended to be inclusive when used in a series and may be used interchangeably with "and/or," unless explicitly stated otherwise (e.g., if used in combination with "either" or "only one of"). Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like. Like numbers refer to like elements throughout. No element, act, or instruction used herein should be construed as critical or essential unless explicitly described as such.

As noted, data centers include racks supporting computing equipment, power systems, cooling systems, and cabling systems. The power systems are connected to power infrastructure of the data center, and the cooling systems may interface with cooling infrastructure of the data center. Additionally, the computing equipment may be connected to data communication infrastructure of the data center by the cabling systems. Due to the connections between the systems on the rack and the infrastructure of the data center, racks are typically only moved at installation and removal. Accordingly, when computing equipment or systems on a rack need to be inspected and/or serviced, a technician must access the data center, find the rack within the data center, and perform the inspection and/or repair. As the size of data centers and the complexity of their layouts increases, inspecting and repairing computing equipment in this manner becomes more difficult for technicians and requires data center designers to dedicate valuable space within data centers to enable technicians to physically access each rack.

Furthermore, computing equipment on a rack may need to be moved to a different location within the data center to, for example, be in closer proximity to other computing equipment, permit data connections between the computing equipment and other computing equipment, provide better cooling to the computing equipment, and/or otherwise optimize operation of the computing equipment. When computing equipment needs to be moved, a technician must access the data center, find the computing equipment, and move the computing equipment from one rack to another rack at the new location. To move the computing equipment, the technician must disconnect the power systems, any cooling systems, and the cabling systems on the rack at the original location from the computing equipment. After moving the computing equipment, the technician must then reconnect the computing equipment to power systems, any cooling systems, and cabling systems on the other rack at the new location. Again, as the size of data centers and the complexity of their layouts increases, moving computing equipment within a data center in this manner becomes more difficult for technicians and requires data center designers to dedicate valuable space within data centers to enable technicians to physically access each rack.

Some embodiments described herein provide intelligent movable racks for a data center and a central system for monitoring and directing the positioning of such racks within the data center. For example, a rack may include computing equipment (e.g., servers, storage devices, etc.) as well as a power system, a cooling system, and a cabling system (e.g., for data communication). The rack may include a controller in communication with the computing equipment, the power system, the cooling system, and the cabling system. The rack may further include a framework for physically supporting one or more of the computing equipment, the power system, the cooling system, the cabling system, and the controller. According to embodiments of the invention and as described in greater detail below, the rack may include a rack interface for physically supporting the framework and operatively connecting the power system, the cooling system, and the cabling system to a receiver to provide connections to the power, cooling, and cabling infrastructure of the data center. The rack interface may be configured to receive an autonomous robot and permit the autonomous robot to move the rack within the data center. The controller may control the power system and the cooling system based in part on the autonomous movement of the rack.

In some embodiments, the rack interface may be configured to operatively connect to multiple receivers at different locations within the data center. Additionally, the rack interface may be configured to mechanically align with the receivers of the data center, thereby causing connectors of the power system, the cooling system, and the cabling system to mechanically align with corresponding connectors of the receivers. The rack interface may be configured to establish a connection to a receiver based on relative horizonal movement or relative vertical movement, such as without direct user intervention.

In some embodiments, and as described in greater detail below with reference to the figures, the rack, using the controller, may be configured to receive operational data from the power system, the cooling system, and the cabling system and then provide the operational data to a central system of the data center. The rack may control the power system, the cooling system, and the cabling system based at least in part on movements of the rack and may activate each system in a correct sequence to prepare for disconnection from the receiver and upon being reconnected with the receiver. Additionally, or alternatively, the rack may determine that the rack needs to be closer to another rack in the data center (e.g., to obtain high-speed communication with computing equipment or data stored on the other rack) and may transmit a command to the autonomous robot to move the rack toward the other rack. The rack may also include an independent power supply for providing power to components of the rack during movement to, for example, continue receiving sensor data from sensors on the rack, transmit sensor data to the central system, receive commands from the central system, and/or the like. The rack may also determine whether a component of the rack requires maintenance (e.g., based on sensor data) and transmit a request for maintenance to the central system.

As noted, some embodiments described herein provide a central system for monitoring and directing the positioning of such racks within the data center. The central system may receive operational data from the racks, such as statuses of various systems on the racks, and determine, based on the operational data, optimal positions for each rack within the data center. If the racks are not optimally positioned, the central system may provide commands to one or more autonomous robots to move the racks to more optimal positions. The central system may also determine the optimal positions based on computing loads on the racks, computing tasks being performed on the racks, locations of data on the racks, and/or the like.

FIG. 1 illustrates a front perspective view of a rack interface 100, in accordance with an embodiment of the invention. As shown in FIG. 1, the rack interface 100 may include a housing 102 and connectors positioned on the housing 102 (e.g., on an upper surface of the housing) for connecting to systems of a rack, such as the rack 300 shown in FIG. 5 and described in greater detail below. Such connectors may include a data port 110, an inflow cooling port 120, an outflow cooling port 122, and power cables 130. For example, the rack may include a cabling system, a cooling system, and a power system, and the data port 110 may connect to the cabling system for providing data connections to computing equipment on the rack. The inflow cooling port 120 and the outflow cooling port 122 may respectively connect to inflow and outflow ports of the cooling system, which may provide cooling to computing equipment on the rack. Finally, the power cables 130 may connect to the power system for providing power to computing equipment on the rack.

As shown in FIG. 1, the housing 102 may be configured to physically support a framework of a rack and may include rack locking mechanisms 160 for engaging and/or securing a framework of the rack to the housing 102 of the rack interface 100. For example, the rack locking mechanism 160 may include threaded bolts, draw latches, toggle latches, and/or the like that semi-permanently secure the rack to the rack interface 100.

As shown in FIG. 1, the rack interface 100 may include floor locking mechanisms 170 for securing the rack interface 100 to the floor of a data center. In some embodiments, the floor locking mechanisms 170 may include actuator-based latches. For example, the floor locking mechanisms 170 may be electronic actuators (e.g., piston-based, lever-based, gear-based, and/or similar types of actuators) that may use power to engage the floor (e.g., via a corresponding latch or feature on the floor) but may not require power to maintain the engagement. As another example, the floor locking mechanisms 170 may be actuators that use mechanical positioning and/or guide mechanisms to cause the floor locking mechanisms 170 to automatically close as the rack interface 100 moves into position over a corresponding mechanism on the floor. In such an example, the floor locking mechanisms 170 may include an electronically controlled release mechanism that, when activated, releases the rack interface 100 from the floor to permit movement of the rack interface 100.

As shown in FIG. 1, the housing 102 may define an opening 105, which may be configured to receive an autonomous robot as shown and described herein with respect to FIGS. 3-5. For example, and as shown in FIG. 1, the opening 105 in the housing 102 may extend vertically upward from a floor surface such that an autonomous robot moving along the floor surface may enter the opening 105 and position itself in the opening between the floor surface and the housing 102 of the rack interface 100.

FIG. 2 illustrates a rear view of the rack interface 100 of FIG. 1, in accordance with an embodiment of the invention. As shown in FIG. 2, the rack interface 100 may also include additional connectors (e.g., a cabling connector, cooling connectors, power connectors, and/or the like) positioned on a rear surface of the housing 102 for connecting the rack interface to infrastructure of the data center via a receiver in the data center, such as the receiver 400 shown in FIGS. 5 and 6 and described in greater detail below. The connectors may include a data port 115, an inflow cooling port 125, an outflow cooling port 127, and a power connector 135. The data port 115 may connect, via the receiver, to data communication infrastructure of the data center such that the computing equipment and the cabling system of the rack is communicatively connected to the data communication infrastructure by the two data ports 110 and 115 of the rack interface 100. The inflow cooling port 125 and the outflow cooling port 127 may respectively connect, via the receiver, to inflow and outflow ports of cooling infrastructure of the data center, which may circulate cooling fluid to the cooling system on the rack using the inflow cooling ports 120 and 125 and outflow ports 122 and 127 of the rack interface 100. Finally, the power connector 135 may connect, via the receiver, to power infrastructure of the data center such that the power system of the rack is connected to the power infrastructure by the power cables 130 and the power connector 135.

The rack interface 100 may also include alignment guides to facilitate alignment of the rack interface 100 and its connectors with receivers in the data center. For example, and as shown in FIG. 2, the alignment guides may include an alignment post 140 and an alignment opening 142, which may respectively pair with counterpart alignment openings and alignment posts on the receivers. In some embodiments, the alignment guides may be configured to ensure alignment of the connectors on the rack interface 100 with corresponding connectors on the receivers (e.g., such that an autonomous robot may move the rack interface 100 and its rack from one receiver to another within the data center).

FIG. 3 illustrates a side view of the rack interface 100 of FIG. 1 and an autonomous robot 200, in accordance with an embodiment of the invention. FIG. 4 illustrates an overhead, cutaway view of the rack interface 100 of FIG. 1 and the autonomous robot 200 of FIG. 3, in accordance with an embodiment of the invention. As shown in FIGS. 2 and 3, the autonomous robot 200 may include a body 202, multiple wheels 204, and lift points 206. The autonomous robot 200 may navigate on the wheels 204 around the data center using one or more navigation techniques (e.g., a code scanning technique, a proximity sensor technique, a machine vision technique, and/or the like). As shown in FIGS. 2 and 3, the body 202 of the autonomous robot 200 may be configured to fit within the opening 105 of the housing 102 of the rack interface 100 such that the autonomous robot 200 is positioned under the rack interface 100. After positioning itself under the rack interface 100, the autonomous robot 200 may extend the lift points 206 away from the body 202 and the floor surface to engage the housing 102 of the rack interface 100 and lift the rack interface 100 (e.g., the rack interface and the rack positioned on the rack interface) off the floor surface. The autonomous robot 200 may then use the wheels 204 to move the rack interface 100 and its rack to another location within the data center. The rack interface 100 and/or its housing 102 may be configured to engage the autonomous robot 200 and remain engaged with the autonomous robot 200 as the autonomous robot 200 lifts the rack interface 100 from the floor surface to move the rack interface 100 within the data center.

FIG. 5 illustrates a perspective view of the rack interface 100 of FIG. 1, the autonomous robot 200 of FIG. 3, a rack 300, and a receiver 400 within a data center 500, in accordance with an embodiment of the invention. As shown in FIG. 5, the rack 300 may include a framework 310, a controller 320, a power system 330, a cooling system 340, a cabling system 350, and computing equipment 360, 362, and 364. The rack interface 100 may be configured to physically support the framework 310 (e.g., on the upper surface of the housing). For example, the rack interface 100 may be positioned on a bottom surface of the framework 310 and oriented toward a floor surface of the data center 500.

As described with respect to FIG. 1, the rack interface 100 may include rack locking mechanisms for securing the rack 300 to the housing of the rack interface 100. For example, the rack locking mechanisms may be configured to engage and semi-permanently secure the framework 310 to the rack interface 100. As shown in FIG. 5, the framework 310 may be configured to physically support the controller 320, the power system 330, the cooling system 340, the cabling system 350, and the computing equipment 360, 362, and 364.

In some embodiments, the controller 320 may be in communication with and/or configured to control functionality of the power system 330, the cooling system 340, the cabling system 350, and/or the computing equipment 360, 362, and 364. For example, the controller 320 may be configured to receive operational data from the power system 330, the cooling system 340, the cabling system 350, and/or the computing equipment 360, 362, and 364. As another example, the power system 330, the cooling system 340, the cabling system 350, and/or the computing equipment 360, 362, and 364 may include one or more sensors configured to generate signals in response to sensed parameters and/or characteristics. In such an example, the controller 320 may be configured to receive the signals and control the power system 330, the cooling system 340, the cabling system 350, and/or the computing equipment 360, 362, and 364 based on the signals. In some embodiments, the controller 320 may be configured to provide the operational data and/or system status data based on the signals to a central system of the data center 500.

The controller 320 may be communication with and/or configured to control functionality of the autonomous robot 200. For example, the controller 320 may include a wireless transceiver configured to communicate with another wireless transceiver in the autonomous robot 200. The controller 320 may be configured to transmit one or more commands to the autonomous robot 200. For example, the controller 320 may be configured to transmit a command to the autonomous robot 200 to move the rack 300 to within a desired distance from another rack in the data center 500 (e.g., such that the computing equipment 360, 362, and 364 may communicate with other computing equipment on the other rack more efficiently and/or at higher speeds). As another example, the controller 320 may be configured to receive data and/or signals from one or more sensors on the rack 300, determine, based on the data and/or signals, an optimal position for the rack 300 within the data center 500, and, if the optimal position does not correspond to a current position of the rack 300, transmit a command to the autonomous robot 200 to move the rack to the optimal position.

In some embodiments, the power system 330 may be configured to receive power, via the connectors and cables of the rack interface 100 and the receiver 400, from power infrastructure of the data center 500. The power system 330 may be configured to provide the power to the controller 320, the cooling system 340, the cabling system 350, the computing equipment 360, 362, and 364, and/or other devices and systems on the rack 300.

In some embodiments, the cooling system 340 may be configured to circulate a cooling fluid (e.g., air, water, liquids, engineered fluids, and/or the like), via the ports of the rack interface 100 and the receiver 400, from cooling infrastructure of the data center 500 to cool the computing equipment 360, 362, and 364. Additionally, or alternatively, the cooling system 340 may include one or more fans for directing a cooling fluid onto portions of the computing equipment 360, 362, and 364.

In some embodiments, the cabling system 350 may be configured to communicatively connect, via the data ports of the rack interface 100 and the receiver 400, to data communication infrastructure of the data center 500. The cabling system 350 may be configured to connect devices and/or systems on the rack 300 (e.g., the computing equipment 360, 362, and 364, the controller 320, and/or the like) to the data communication infrastructure of the data center 500.

In some embodiments, the computing equipment 360, 362, and 364 may include one or more graphics processing units, central processing units, storage components, field replaceable units, customer replaceable units, switches (e.g., NVSwitches), data processing units (e.g., BlueField data processing units), high bandwidth memory, and/or the like.

The computing equipment 360, 362, and 364 may perform one or more computing operations, generate data, store data, and/or the like in accordance with an overall design of the data center 500.

FIG. 6 illustrates a front view of the receiver 400 of FIG. 5, in accordance with an embodiment of the invention. As shown in FIG. 6, the receiver 400 may include a housing 402 and connectors positioned on the housing 402 (e.g., on an outward facing surface of the housing 402) for forming operative connections with the rack interface 100. The connectors may include a data port 415, an inflow cooling port 425, an outflow cooling port 427, and a power connector 435. The data port 415 of the receiver 400 may be connected to the data communication infrastructure of the data center 500 and be configured to connect to the data port 115 of the rack interface 100. The inflow cooling port 425 and the outflow cooling port 427 of the receiver 400 may be respectively connected to inflow and outflow cooling ports of the cooling infrastructure of the data center 500 and may be configured to respectively connect to the inflow cooling port 125 and the outflow cooling port 127 of the rack interface. Finally, the power connector 435 of the receiver 400 may be connected to the power infrastructure of the data center 500 and may be configured to connect to the power connector 135 of the rack interface 100.

The receiver 400 may also include alignment guides to facilitate alignment of the rack interface 100 and its connectors with the receiver 400 in the data center and its connectors. For example, and as shown in FIG. 6, the alignment guides of the receiver 400 may include an alignment opening 440 and an alignment post 442, which may respectively pair with the counterpart alignment post 140 and alignment opening 142 on the rack interface 100 (shown and described above with respect to FIGS. 2-4). In some embodiments, the alignment guides may be configured to ensure alignment of the connectors on the receiver 400 with corresponding connectors on the rack interface 100 (e.g., such that an autonomous robot may move the rack interface 100 and its rack from one receiver to another within the data center).

Components of the rack interface 100 and the receiver 400 (e.g., housings, connectors, alignment guides, and/or the like) may be configured such that alignment of the rack interface 100 with the receiver 400 causes connectors of the rack interface 100 to mechanically align with corresponding connectors of the receiver 400. In some embodiments, the components of the rack interface 100 and the receiver 400 may be configured to operatively connect to each other based on horizontal movement of the rack 300 and/or the rack interface 100 with respect to the receiver 400. Additionally, or alternatively, the components of the rack interface 100 and the receiver 400 may be configured to operatively connect to each other based on vertical movement of the rack 300 and/or the rack interface 100 with respect to the receiver 400. As an example, the connectors of the rack interface 100 and the receiver 400 may be positioned on the respective housings such that relative movement of the rack interface 100 with respect to the receiver 400 operatively connects the systems of the rack 300 to the receiver 400.

FIG. 7 illustrates a perspective view of multiple receivers 400A and 400B within a data center 500, in accordance with an embodiment of the invention. The receivers 400A and 400B may be similar to the receiver 400 shown and described herein with respect to FIGS. 5 and 6. For example, each of the receivers 400A and 400B may include a housing and connectors positioned on the housing for connecting to the corresponding connectors on the rack interface 100. The data center 500 may include a plurality of such receivers each in a different location within the data center such that the autonomous robot 200 may lift the rack interface 100 and the rack 300 and move them to another location within the data center 500.

For example, the rack interface 100 and the rack 300 may be initially positioned such that the connectors of the rack interface 100 are connected to the corresponding connectors of the receiver 400A. The autonomous robot 200 may move across the floor of the data center 500 and position itself in the opening 105 of the rack interface 100, as described above in connection with FIGS. 1-5. The autonomous robot 200 may then lift the rack interface 100 and the rack 300 off the floor surface and move the rack interface 100 and the rack 300 in a direction away from the receiver 400A, thereby disconnecting the connectors of the rack interface 100 from the corresponding connectors of the receiver 400A (e.g., without manual intervention from a technician). The autonomous robot 200 may then navigate across the floor of the data center 500 with the rack interface 100 and the rack 300 and position the rack interface 100 into alignment with the receiver 400B (e.g., with the help of alignment guides on the rack interface 100 and the receiver 400B), thereby connecting the connectors of the rack interface 100 with the corresponding connectors of the receiver 400B (e.g., without direct, manual, and/or continuous intervention from a technician). In this way, the rack interface 100, the autonomous robot 200, and the receivers of the data center 500 may permit autonomous repositioning of racks within the data center 500.

FIG. 8 illustrates a diagram and method 800 of intelligently managing a rack 300 within a data center, in accordance with an embodiment of the invention. In some embodiments, a controller on a rack (e.g., similar to the controller 320 on the rack 300 as described herein with respect to FIG. 5) may perform one or more of the steps of the method 800. As shown in FIG. 8, the method 800 may involve the rack interface 100, the autonomous robot 200, the rack 300, and a central system 600 of a data center. In some embodiments, the rack interface 100, the autonomous robot 200, and the rack 300 may correspond to those described herein with respect to FIGS. 1-7.

As shown in block 805, the method 800 may include receiving an indication that the rack 300 is to be moved. For example, the central system 600 of the data center may transmit an indication to a controller on the rack 300 that the rack 300 is going to be moved. As another example, the central system 600 may transmit a command to the autonomous robot 200 to move the rack 300, and the autonomous robot 200 may provide the indication to the controller. As yet another example, the controller may receive a signal from computing equipment or a sensor on the rack 300 indicating that the rack 300 needs to be moved (e.g., because the computing equipment is too hot, too cold, too far away from other computing equipment in the data center, and/or the like).

As shown in block 810, the method 800 may include deactivating the power system on the rack 300 to shut down the computing equipment on the rack 300. For example, the controller on the rack 300 may provide a command to the computing equipment to shut down and then deactivate the power system on the rack 300.

As shown in block 815, the method 800 may include determining whether the computing equipment has achieved a threshold temperature. For example, the rack 300 may include one or more temperature sensors for detecting the temperature of the computing equipment, and the controller may receive one or more signals and/or temperature readings from the temperature sensors. The controller may determine, based on the signals and/or temperature readings, whether the computing equipment requires further temperature regulation from the cooling system (e.g., whether the computing equipment has reached a safe temperature, whether the computing equipment is cool enough, and/or the like).

As shown in block 820, the method 800 may include, based on determining that the computing equipment has not achieved the threshold temperature, preventing movement of the rack 300. For example, the controller may provide one or more commands to the autonomous robot 200 to prevent the autonomous robot 200 from moving the rack 300.

As shown in block 825, the method 800 may also include, based on determining that the computing equipment has not achieved the threshold temperature, maintaining operation of the cooling system. For example, the controller may provide one or more commands to the cooling system to continue providing the cooling fluid to the computing equipment. As another example, the controller may provide one or more commands to the cooling system to maintain operation of fans for cooling the computing equipment. The method 800 may include determining whether the computing equipment has achieved the threshold temperature at regular intervals and/or continuously and prevent movement of the rack and maintain operation of the cooling system until the computing equipment has achieved the threshold temperature.

As shown in block 830, the method 800 may include, based on determining that the computing equipment has achieved the threshold temperature, deactivating the cooling system. For example, the controller may provide one or more commands to the cooling system to stop providing the cooling fluid to the computing equipment. As another example, the controller may provide one or more commands to the cooling system to stop operation of fans for cooling the computing equipment.

As shown in block 835, the method 800 may include permitting movement of the rack. For example, the controller may, after deactivating the cooling system, may provide one or more commands to the autonomous robot 200 to permit the autonomous robot 200 to move the rack 300. The autonomous robot 200 may then move the rack 300 within the data center. For example, the autonomous robot 200 may navigate into an opening in the rack interface 100, lift the rack interface 100 and the rack 300 from the floor, and move the rack interface 100 and the rack 300 to another receiver at another location in the data center.

As shown in block 840, the method 800 may include determining whether the rack interface is operatively connected to the receiver (e.g., the target receiver to which the rack is being moved). For example, the controller may determine, based on one or more sensors on the rack and/or based on an operational state of the computing equipment, whether the power system, the cabling system, and/or the cooling system are properly connected to the corresponding infrastructure of the data center. If the rack is determined not to be operatively connected to the receiver, remedial measures may be triggered. For example, the autonomous robot 200 may be directed to re-attempt engagement with the receiver by moving or repositioning itself with respect to the receiver and its connections. Alternatively, a technician may be summoned via an alert, a message, or an alarm, to manually investigate the reason for failure of the operative connection with the receiver.

As shown in block 845, in the event the rack interface is successfully connected to the receiver, the method 800 may include activating the cooling system. For example, the controller may provide one or more commands to the cooling system to initiate provision of the cooling fluid to the computing equipment. As another example, the controller may provide one or more commands to the cooling system to initiate operation of fans for cooling the computing equipment.

As shown in block 850, the method 800 may include determining whether the computing equipment has achieved an operational temperature. For example, the rack 300 may include one or more temperature sensors for detecting the temperature of the computing equipment, and the controller may receive one or more signals and/or temperature readings from the temperature sensors. The controller may determine, based on the signals and/or temperature readings, whether the computing equipment requires further temperature regulation from the cooling system (e.g., whether the computing equipment has reached a safe operational temperature, whether the computing equipment is cool enough, and/or the like). The method 800 may include determining whether the computing equipment has achieved the operational temperature at regular intervals and/or continuously and prevent activation of further systems on the rack 300 until the computing equipment has achieved the operational temperature.

As noted, in some embodiments, the cooling system may include one or more fans for cooling the computing equipment. In such embodiments, the method 800 may include determining whether a speed of the fans has achieved an operational threshold. For example, the controller may determine, based on signals from one or more sensors on the cooling system, whether the fans have achieved a high enough speed to provide sufficient cooling to the computing equipment (e.g., to prevent the computing equipment from overheating during operation). The method 800 may include determining whether the speed of the fans has achieved the operational threshold at regular intervals and/or continuously and prevent activation of further systems on the rack 300 until the computing equipment has achieved the operational temperature.

In some embodiments, the cooling system may include coolant piping for circulating coolant for cooling the computing equipment. In such embodiments, the method 800 may include determining whether a volume flow rate of the coolant has achieved an operational threshold. For example, the controller may determine, based on signals from one or more sensors on the cooling system, whether the coolant is moving quickly enough to provide sufficient cooling to the computing equipment (e.g., to prevent the computing equipment from overheating during operation). The method 800 may include determining whether the volume flow rate of the coolant has achieved the operational threshold at regular intervals and/or continuously and prevent activation of further systems on the rack 300 until the computing equipment has achieved the operational temperature.

As shown in block 855, the method 800 may include, based on determining that the computing equipment has achieved the operational temperature, activating the power system to provide power from the power infrastructure to the computing equipment. For example, the controller may provide a command to the power system to activate and/or provide a command to the computing equipment to begin operation.

As shown in block 860, the method 800 may include receiving operational data from the power system, the cooling system, and the cabling system. For example, the controller may be communicatively connected to and receive the operational data from the power system, the cooling system, and the cabling system. As another example, the rack 300, the power system, the cooling system, and/or the cabling system may include one or more sensors configured to generate signals regarding sensed attributes, properties, characteristics, and/or the like of the power system, the cooling system, and/or the cabling system, and the operational data may be based on the signals generated by the sensors and provided to the controller.

As shown in block 865, the method 800 may include providing the operational data to the central system 600 of the data center. For example, the controller may be communicatively connected to the central system 600 (e.g., via a wireless transceiver, via the cabling system, and/or the like) and may provide the operational data to the central system 600. In some embodiments, the central system 600 may use the operational data from multiple racks within the data center to determine which computing equipment on which racks should perform different computing operations of the data center, determine where each rack should be positioned within the data center, determine whether a rack needs maintenance, and/or the like.

In some embodiments, the method 800 may include receiving the operational data and/or providing the operational data to the central system 600 of the data center at regular intervals and/or continuously. For example, the rack 300 may include an independent power supply (e.g., a battery, a rechargeable battery, a power storage component, and/or the like) supported by the framework. The independent power supply may be configured to provide power to the controller, sensors on the rack, other components on the rack, and/or the like during movement of the rack (e.g., when the power system of the rack is not connected to the power infrastructure of the data center). Using the power from the independent power supply, the controller may continue to receive the operational data and/or provide the operational data to the central system 600 of the data center during movement of the rack.

The method 800 may include additional embodiments, such as any single embodiment or any combination of embodiments described above and/or in connection with one or more other methods and/or processes described elsewhere herein. Although FIG. 8 shows example blocks of the method 800, in some embodiments, the method 800 may include additional blocks, fewer blocks, different blocks, or differently arranged blocks than those depicted in FIG. 8. Additionally, or alternatively, two or more of the blocks of the method 800 may be performed in parallel and/or simultaneously.

FIG. 9 illustrates a system environment 900 for autonomously moving racks within a data center, in accordance with an embodiment of the invention. As shown in FIG. 9, the system environment 900 may include one or more controller devices of racks 910 (e.g., similar to the controller 320 of the rack 300 shown and described in connection with FIGS. 5 and 8), a central system of a data center 920 (e.g., similar to the central system of the data center 500 shown and described in connection with FIG. 5 and/or similar to the central system 600 of the data center shown and described in connection with FIG. 8), one or more autonomous robot devices 930 (e.g., similar to the autonomous robot 200 shown and described in connection with FIGS. 3-5), a data center management platform 940, a cloud computing environment 950 with computing resources 955, and a network 960. Devices of environment 900 may interconnect via wired connections, wireless connections, or a combination of wired and wireless connections.

In some embodiments, the controller devices of the racks 910 may include one or more devices capable of receiving, generating, storing, processing, and/or providing signals, data, commands, instructions, and/or the like. For example, the controller devices of the racks 910 may include one or more devices configured to receive, process, and/or provide signals, data, and/or commands from and/or to (i) sensors, systems, and/or computing equipment on a rack, (ii) the central system of the data center 920, and/or (ii) the autonomous robot devices 930. In some embodiments, the controller devices of the racks 910 may process the signals, data, and/or commands to make determinations and/or decisions regarding operation of systems and/or computing equipment on a rack, positioning of a rack within a data center, operability of connections between receivers and rack interfaces, positioning of the autonomous robot devices 930, and/or the like.

In some embodiments, the central system of the data center 920 may include one or more devices capable of receiving, generating, storing, processing, and/or providing signals, data, commands, instructions, and/or the like. For example, the central system of the data center 920 may include one or more devices and/or systems configured to receive, process, and/or provide signals, data, and/or commands from and/or to the controller devices of the racks 910, the autonomous robot devices 930, and/or systems external to the data center. In some embodiments, the central system of the data center 920 may process the signals, data, and/or commands to make determinations and/or decisions regarding operation of systems and/or computing equipment on racks in the data center, positioning of racks within the data center, maintenance required on computing equipment and/or racks within the data center, positioning of the autonomous robot devices 930, and/or the like.

In some embodiments, the autonomous robot devices 930 may include one or more devices capable of autonomously lifting and/or moving racks within a data center. For example, the autonomous robot devices 930 may include one or more devices configured to receive, process, and/or provide signals, data, commands, instructions, and/or the like from and/or to the controller devices of the racks 910 and/or the central system of the data center 920. In some embodiments, the autonomous robot devices 930 may include one or more devices configured to perform one or more navigation techniques (e.g., a code scanning technique, a proximity sensor technique, a machine vision technique, and/or the like) to intelligently move within the data center. For example, the autonomous robot devices 930 may include one or more sensors (e.g., images sensors, proximity sensors, and/or the like) and/or transceivers for performing one or more navigation techniques.

The network 960 may include one or more wired and/or wireless networks. For example, the network 960 may include a cellular network (e.g., a long-term evolution (LTE) network, a code division multiple access (CDMA) network, a 3G network, a 4G network, a 5G network, another type of next generation network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

In some embodiments, the data center management platform 940 may include one or more computing resources assigned to receive signals, data, and/or the like regarding computing equipment and/or racks within a data center as described herein. For example, the data center management platform 940 may be a platform implemented by the cloud computing environment 950 that may receive signals, data, and/or the like from the controller devices of the racks 910, the central system of the data center 920, the computing equipment, and/or the racks within the data center. In some embodiments, the data center management platform 940 may be implemented by computing resources 955 of the cloud computing environment 950.

The data center management platform 940 may include a server device or a group of server devices. In some embodiments, data center management platform 940 may be hosted in cloud computing environment 950. Notably, while embodiments described herein describe the data center management platform 940 as being hosted in cloud computing environment 950, in some embodiments, the data center management platform 940 may be non-cloud-based or may be partially cloud-based.

The cloud computing environment 950 may include an environment that delivers computing as a service, whereby shared resources, services, etc. may be provided to other devices, such as the controller devices of the racks 910. The cloud computing environment 950 may provide computation, software, data access, storage, and/or other services that do not require end-user knowledge of a physical location and configuration of a system and/or a device that delivers the services. As shown, the cloud computing environment 950 may include the data center management platform 940 and the computing resource 955.

The computing resource 955 may include one or more personal computers, workstation computers, server devices, or another type of computation and/or communication device. In some embodiments, the computing resource 955 may host the data center management platform 940. The cloud resources may include compute instances executing in the computing resource 955, storage devices provided in the computing resource 955, data transfer devices provided by the computing resource 955, etc. In some embodiments, the computing resource 955 may communicate with other computing resources 955 via wired connections, wireless connections, or a combination of wired and wireless connections.

As further shown in FIG. 9, the computing resource 955 may include a group of cloud resources, such as one or more applications ("APPs") 955-1, one or more virtual machines ("VMs") 955-2, virtualized storage ("VSs") 955-3, one or more hypervisors ("HYPs") 955-4, or the like.

The application 955-1 may include one or more software applications that may be provided to or accessed by devices, such as the controller devices of the racks 910, the central system of the data center 920, and/or the autonomous robot devices 930. The application 955-1 may eliminate a need to install and execute the software applications on devices, such as the controller devices of the racks 910, the central system of the data center 920, and/or the autonomous robot devices 930. For example, the application 555-1 may include software associated with the data center management platform 940 and/or any other software capable of being provided via the cloud computing environment 950. In some embodiments, one application 955-1 may send and/or receive information to and/or from one or more other applications 955-1 via virtual machine 955-2.

The virtual machine 955-2 may include a software implementation of a machine (e.g., a computer) that executes programs like a physical machine. The virtual machine 955-2 may be either a system virtual machine or a process virtual machine, depending upon use and degree of correspondence to any real machine by the virtual machine 955-2. A system virtual machine may provide a complete system platform that supports execution of a complete operating system ("OS"). A process virtual machine may execute a single program and may support a single process. In some embodiments, the virtual machine 955-2 may execute on behalf of a user (e.g., devices, such as the controller devices of the racks 910, the central system of the data center 920, the autonomous robot devices 930, the data center management platform 940, and/or the like) and may manage infrastructure of the cloud computing environment 950, such as data management, synchronization, or long-duration data transfers.

The virtualized storage 955-3 may include one or more storage systems and/or one or more devices that use virtualization techniques within the storage systems or devices of the computing resource 955. In some embodiments, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

The hypervisor 955-4 may provide hardware virtualization techniques that allow multiple operating systems (e.g., "guest operating systems") to execute concurrently on a host computer, such as the computing resource 955. The hypervisor 955-4 may present a virtual operating platform to the guest operating systems and may manage the execution of the guest operating systems. Multiple instances of a variety of operating systems may share virtualized hardware resources.

The number and arrangement of devices and networks shown in FIG. 9 are provided as one or more examples. In practice, there may be additional devices and/or networks, fewer devices and/or networks, different devices and/or networks, or differently arranged devices and/or networks than those shown in FIG. 9. Furthermore, two or more devices shown in FIG. 9 may be implemented within a single device, or a single device shown in FIG. 9 may be implemented as multiple, distributed devices. Additionally or alternatively, a set of devices (e.g., one or more devices) of the environment 900 may perform one or more functions described as being performed by another set of devices of the environment 900.

FIG. 10 is a diagram of example components of a device 1000. In some embodiments, the device 1000 may correspond to the controller, the central system of the data center, the autonomous robot, and/or the data center management platform, described herein with respect to FIGS. 3-5 and 8-9. Additionally or alternatively, the controller, the central system of the data center, the autonomous robot, and/or the data center management platform, described herein with respect to FIGS. 3-5 and 8-9 may include one or more devices 1000 and/or one or more components of the device 1000. As shown in FIG. 10, the device 1000 may include a bus 1010, a processor 1020, a memory 1030, a storage component 1040, an input component 1050, an output component 1060, and a communication interface 1070.

Bus 1010 may include a component that permits communication among multiple components of the device 1000. The processor 1020 may be implemented in hardware, firmware, and/or a combination of hardware and software. The processor 1020 may be a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, the processor 1020 may include one or more processors capable of being programmed to perform a function. The memory 1030 may include a random access memory (RAM), a read only memory (ROM), and/or another type of dynamic or static storage device (e.g., a flash memory, a magnetic memory, and/or an optical memory) that stores information and/or instructions for use by the processor 1020.

The storage component 1040 may store information and/or software related to the operation and use of the device 1000. For example, the storage component 1040 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

The input component 1050 may include a component that permits the device 1000 to receive information, such as via user input (e.g., a touch screen display, a keyboard, a keypad, a mouse, a button, a switch, and/or a microphone). Additionally or alternatively, the input component 1050 may include a component for determining location (e.g., a global positioning system (GPS) component) and/or a sensor (e.g., an accelerometer, a gyroscope, an actuator, another type of positional or environmental sensor, and/or the like). The output component 1060 may include a component that provides output information from the device 1000 (via, e.g., a display, a speaker, a haptic feedback component, an audio or visual indicator, and/or the like).

The communication interface 1070 may include a transceiver-like component (e.g., a transceiver, a separate receiver, a separate transmitter, and/or the like) that enables the device 1000 to communicate with other devices, such as via a wired connection, a wireless connection, or a combination of wired and wireless connections. The communication interface 1070 may permit the device 1000 to receive information from another device and/or provide information to another device. For example, the communication interface 1070 may include an Ethernet interface, an optical interface, a coaxial interface, an infrared interface, a radio frequency (RF) interface, a universal serial bus (USB) interface, a Wi-Fi interface, a cellular network interface, and/or the like.

The device 1000 may perform one or more processes described herein. The device 1000 may perform these processes based on the processor 1020 executing software instructions stored by a non-transitory computer-readable medium, such as the memory 1030 and/or the storage component 1040. As used herein, the term "computer-readable medium" refers to a non-transitory memory device. A memory device includes memory space within a single physical storage device or memory space spread across multiple physical storage devices.

Software instructions may be read into the memory 1030 and/or the storage component 1040 from another computer-readable medium or from another device via the communication interface 1070. When executed, software instructions stored in the memory 1030 and/or the storage component 1040 may cause the processor 1020 to perform one or more processes described herein. Additionally, or alternatively, hardware circuitry may be used in place of or in combination with software instructions to perform one or more processes described herein. Thus, embodiments described herein are not limited to any specific combination of hardware circuitry and software.

The number and arrangement of components shown in FIG. 10 are provided as an example. In practice, the device 1000 may include additional components, fewer components, different components, or differently arranged components than those shown in FIG. 10. Additionally or alternatively, a set of components (e.g., one or more components) of the device 1000 may perform one or more functions described as being performed by another set of components of the device 1000.

As will be appreciated by one of ordinary skill in the art in view of this disclosure, the present invention may include and/or be embodied as an apparatus (including, for example, a system, machine, device, computer program product, and/or the like), as a method (including, for example, a business method, computer-implemented process, and/or the like), or as any combination of the foregoing. Accordingly, embodiments of the present invention may take the form of an entirely business method embodiment, an entirely software embodiment (including firmware, resident software, micro-code, stored procedures in a database, or the like), an entirely hardware embodiment, or an embodiment combining method, software, and hardware aspects that may generally be referred to herein as a "system." Furthermore, embodiments of the present invention may take the form of a computer program product that includes a computer-readable storage medium having one or more computer-executable program code portions stored therein. As used herein, a processor and/or a processing device, which may include one or more processors, may be "configured to" perform a certain function in a variety of ways, including, for example, by having one or more general-purpose circuits perform the function by executing one or more computer-executable program code portions embodied in a computer-readable medium, and/or by having one or more application-specific circuits perform the function.

It will be understood that any suitable computer-readable medium may be utilized. The computer-readable medium may include, but is not limited to, a non-transitory computer-readable medium and/or a non-transitory storage device, such as a tangible electronic, magnetic, optical, electromagnetic, infrared, and/or semiconductor system, device, and/or other apparatus. For example, in some embodiments, the non-transitory computer-readable medium and/or the non-transitory storage device may include a tangible medium such as a portable computer diskette, a hard disk, a random access memory (RAM), a read-only memory (ROM), an erasable programmable read-only memory (EPROM or Flash memory), a compact disc read-only memory (CD-ROM), and/or some other tangible optical and/or magnetic storage device. In other embodiments of the present invention, however, the computer-readable medium may be transitory, such as, for example, a propagation signal including computer-executable program code portions embodied therein.

One or more computer-executable program code portions for carrying out operations of the present invention may include object-oriented, scripted, and/or unscripted programming languages, such as, for example, Java, Perl, Smalltalk, C++, SAS, SQL, Python, Objective C, JavaScript, and/or the like. In some embodiments, the one or more computer-executable program code portions for carrying out operations of embodiments of the present invention are written in conventional procedural programming languages, such as the "C" programming languages and/or similar programming languages. The computer program code may alternatively or additionally be written in one or more multi-paradigm programming languages, such as, for example, F #.

Some embodiments of the present invention are described herein with reference to flowchart illustrations and/or block diagrams of apparatus and/or methods. It will be understood that each block included in the flowchart illustrations and/or block diagrams, and/or combinations of blocks included in the flowchart illustrations and/or block diagrams, may be implemented by one or more computer-executable program code portions. These one or more computer-executable program code portions may be provided to a processor of a general purpose computer, special purpose computer, and/or some other programmable data processing apparatus in order to produce a particular machine, such that the one or more computer-executable program code portions, which execute via the processor of the computer and/or other programmable data processing apparatus, create mechanisms for implementing the steps and/or functions represented by the flowchart(s) and/or block diagram block(s).

The one or more computer-executable program code portions may be stored in a transitory and/or non-transitory computer-readable medium (e.g., a memory) that may direct, instruct, and/or cause a computer and/or other programmable data processing apparatus to function in a particular manner, such that the computer-executable program code portions stored in the computer-readable medium produce an article of manufacture including instruction mechanisms which implement the steps and/or functions specified in the flowchart(s) and/or block diagram block(s).

The one or more computer-executable program code portions may also be loaded onto a computer and/or other programmable data processing apparatus to cause a series of operational steps to be performed on the computer and/or other programmable apparatus. In some embodiments, this produces a computer-implemented process such that the one or more computer-executable program code portions which execute on the computer and/or other programmable apparatus provide operational steps to implement the steps specified in the flowchart(s) and/or the functions specified in the block diagram block(s). Alternatively, computer-implemented steps may be combined with, and/or replaced with, operator—and/or human-implemented steps in order to carry out an embodiment of the present invention.

Although many embodiments of the present invention have just been described above, the present invention may be embodied in many different forms and should not be construed as limited to the embodiments set forth herein; rather, these embodiments are provided so that this disclosure will satisfy applicable legal requirements. Also, it will be understood that, where possible, any of the advantages, features, functions, devices, and/or operational aspects of any of the embodiments of the present invention described and/or contemplated herein may be included in any of the other embodiments of the present invention described and/or contemplated herein, and/or vice versa.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations, modifications, and combinations of the just described embodiments may be configured without departing from the scope and spirit of the invention. Therefore, it is to be understood that, within the scope of the appended claims, the invention may be practiced other than as specifically described herein.

What is claimed is:

1. A rack for a data center, the rack comprising:
    a controller configured to be in communication with computing equipment in the rack; and
    a framework configured to physically support, within a data center, the computing equipment and the controller; and
    a rack interface in communication with the controller and configured to:
        physically support the framework;
        operatively connect at least the computing equipment with a receiver of a data center; and
        receive an autonomous robot, wherein the autonomous robot is configured to move the rack within the data center;
    wherein the controller is configured to control functionality of the computing equipment during movement of the rack by the autonomous robot.

2. The rack of claim 1, wherein the data center comprises a first receiver and a second receiver, wherein the first and second receivers are in different locations within the data center, and wherein the rack interface is configured to permit movement of the rack from the first receiver to the second receiver by disconnecting the rack interface from an operative connection with the first receiver and operatively connecting the rack interface to the second receiver following movement of the rack.

3. The rack of claim 1, wherein the rack interface is configured to operatively connect a power system, a cooling system, and a cabling system to the receiver of the data center, and wherein the controller is configured to control at least one of the power system, the cooling system, and the cabling system based on the movement of the rack by the autonomous robot.

4. The rack of claim 3, wherein the rack interface is configured to mechanically align with the receiver of the data center, such that mechanical alignment of the rack interface with the receiver causes connectors of the power system, the cooling system, and the cabling system to mechanically align with corresponding connectors of the receiver.

5. The rack of claim 3, wherein the rack interface comprises (i) a power connector configured to connect, via the receiver, the power system to power infrastructure of the data center, (ii) a cooling connector configured to connect, via the receiver, the cooling system to cooling infrastructure of the data center, and (iii) a cabling connector configured to connect, via the receiver, the cabling system to data communication infrastructure of the data center.

6. The rack of claim 3, wherein the controller is configured to:
    receive operational data from the power system, the cooling system, and the cabling system; and
    provide the operational data to a central system of the data center.

7. The rack of claim 6, wherein each of the power system, the cooling system, and the cabling system comprises a sensor configured to generate a signal, and wherein the operational data is based on the signal from each sensor.

8. The rack of claim 3, wherein the controller is configured to:
    after movement of the rack within the data center, determine whether the rack interface is operatively connected to the receiver;
    in response to determining that the rack interface is operatively connected to the receiver:
        activate the cooling system;
        after activating the cooling system, determine whether the cooling system has achieved an operational threshold; and
        in response to determining that the cooling system has achieved the operational threshold, activate the power system to provide power from power infrastructure of the data center to the computing equipment.

9. The rack of claim 8, wherein the cooling system comprises fans, wherein activating the cooling system comprises turning on the fans, and wherein the operational threshold comprises a speed of the fans.

10. The rack of claim 8, wherein the cooling system comprises coolant piping, wherein activating the cooling system comprises initiating a flow of coolant through the coolant piping, and wherein the operational threshold comprises a volume flow rate of the coolant.

11. The rack of claim 3, wherein the controller is configured to:
    receive an indication that the rack is to be moved;
    in response to receiving the indication:
        deactivate the power system to shut down the computing equipment;
        determine whether the computing equipment has achieved a threshold temperature;
        in response to determining that the computing equipment has not achieved the threshold temperature:
            prevent movement of the rack; and
            maintain operation of the cooling system to continue cooling the computing equipment; and
        in response to determining that the computing equipment has achieved the threshold temperature:
            deactivate the cooling system; and
            after deactivating the cooling system, permit movement of the rack.

12. The rack of claim 1, wherein the rack interface is configured to operatively connect to the receiver of the data center based on at least one of a horizontal movement of the rack with respect to the receiver or a vertical movement of the rack with respect to the receiver.

13. The rack of claim 1, wherein the rack interface is configured to engage the autonomous robot moving along a floor surface of the data center and to remain engaged with the autonomous robot as the autonomous robot lifts the rack from the floor surface to move the rack within the data center.

14. The rack of claim 1, wherein the rack interface is positioned on a bottom surface of the framework and oriented toward a floor surface of the data center, and wherein the rack interface is configured to operatively connect to the receiver of the data center based on a vertical movement of the rack with respect to the receiver.

15. The rack of claim 1, wherein the controller is configured to transmit a command to the autonomous robot to move the rack to within a desired distance from another rack of the data center.

16. The rack of claim 1, comprising an independent power supply supported by the framework, wherein the independent power supply is configured to provide, during movement of the rack, power to the controller.

17. The rack of claim 1, wherein the controller is configured to:
   receive data from one or more sensors;
   determine, based on the data, an optimal position for the rack within the data center; and
   if the optimal position does not correspond to a current position of the rack within the data center, transmit a command to the autonomous robot to move the rack to the optimal position.

18. A system for autonomously moving racks within a data center, the system comprising:
   an autonomous robot configured to lift racks from a floor surface of a data center and move the racks within the data center; and
   a rack interface configured to:
      physically support a framework of a rack within the data center;
      operatively connect systems of the rack to a receiver of the data center; and
      receive the autonomous robot and permit the autonomous robot to move the rack within the data center.

19. A rack interface for enabling autonomous movement of a rack within a data center, the rack interface comprising:
   a housing configured to physically support a framework of a rack within a data center and receive an autonomous robot for moving the rack within the data center; and
   one or more connectors positioned on the housing and configured to operatively connect systems of the rack to a receiver of the data center.

20. The rack interface of claim 19, wherein the one or more connectors are positioned on the housing such that relative movement of the rack interface with respect to the receiver operatively connects the systems of the rack to the receiver.

21. The rack interface of claim 19, comprising one or more alignment guides for aligning the one or more connectors with the receiver.

22. The rack interface of claim 19, comprising one or more openings for receiving one or more alignment guides of the receiver for aligning the one or more connectors with the receiver.

23. The rack interface of claim 19, comprising one or more locking mechanisms for engaging the framework of the rack.

24. The rack interface of claim 19, comprising one or more locking mechanisms for engaging a floor surface of the data center.

* * * * *